US012662343B2

(12) United States Patent
Kim et al.

(10) Patent No.: US 12,662,343 B2
(45) Date of Patent: Jun. 23, 2026

(54) REEL-TO-REEL SURFACE PRESS APPARATUS

(71) Applicant: HAESUNG DS CO., LTD.,
Gyeongsangnam-do (KR)

(72) Inventors: Yong Nam Kim, Gyeongsangnam-do
(KR); Jae Hoon Jang,
Gyeongsangnam-do (KR)

(73) Assignee: HAESUNG DS CO., LTD,
Gyeongsangnam-Do (KR)

( * ) Notice: Subject to any disclaimer, the term of this
patent is extended or adjusted under 35
U.S.C. 154(b) by 871 days.

(21) Appl. No.: 17/818,516

(22) Filed: Aug. 9, 2022

(65) Prior Publication Data

US 2023/0094795 A1     Mar. 30, 2023

(30) Foreign Application Priority Data

Sep. 29, 2021     (KR) ........................ 10-2021-0128957

(51) Int. Cl.
*B65H 18/10*          (2006.01)
*B65H 18/12*          (2006.01)
          (Continued)
(52) U.S. Cl.
CPC ........... *B65H 18/103* (2013.01); *B65H 18/12*
(2013.01); *B65H 23/032* (2013.01);
          (Continued)
(58) Field of Classification Search
CPC .... B65H 18/103; B65H 18/12; B65H 23/032;
          B65H 23/1884; B65H 2404/1452;
          (Continued)

(56) References Cited

U.S. PATENT DOCUMENTS 6,032,845  A  *   3/2000  Piccone ............. H05K 13/0419
                                                  226/139
2005/0211404  A1*  9/2005  Makkonen ............. G01B 17/00
                                                  162/263
          (Continued)

FOREIGN PATENT DOCUMENTS

CN          106291996          1/2017
CN          108630883          10/2018
          (Continued)

OTHER PUBLICATIONS

KR-200421129-Y1 English translation (Year: 2004).*
          (Continued)

*Primary Examiner* — Galen H Hauth
(74) *Attorney, Agent, or Firm* — Perman & Green, LLP

(57)          ABSTRACT

Disclosed in a reel-to-reel surface press apparatus. The
reel-to-reel surface press apparatus includes an uncoiler and
a recoiler, both transferring a component in a reel-to-reel
method, a press disposed between the uncoiler and the
recoiler, comprising a press plate pressing the component,
and having a plurality of reference holes at an equal pitch
along an edge of the press plate, a feeder disposed at the rear
of the uncoiler and moving the component, and a controller
configured to control the component to be transferred based
on at least any one of the plurality of reference holes.

10 Claims, 5 Drawing Sheets

(51) Int. Cl.
   *B65H 23/032* (2006.01)
   *B65H 23/188* (2006.01)
   *H05K 3/20* (2006.01)
(52) U.S. Cl.
   CPC . *B65H 23/1884* (2013.01); *B65H 2404/1452* (2013.01); *B65H 2511/13* (2013.01); *B65H 2513/11* (2013.01); *H05K 3/20* (2013.01); *H05K 2203/0534* (2013.01)
(58) Field of Classification Search
   CPC ............ B65H 2511/13; B65H 2513/11; B65H 2301/414324; B65H 23/0258; B65H 2553/30; B65H 20/22; B65H 20/24; H05K 3/20; H05K 2203/0534; H05K 3/0055; H05K 3/3452; H05K 2203/0278; H05K 2203/1545; G03F 7/0002
   See application file for complete search history.

(56) References Cited

U.S. PATENT DOCUMENTS

| | | | | | |
|---|---|---|---|---|---|
| 2008/0056788 | A1* | 3/2008 | Okutsu | ................. | G03F 7/2051 |
| | | | | | 399/372 |
| 2009/0121065 | A1* | 5/2009 | Sato | ....................... | B65H 20/32 |
| | | | | | 242/364.11 |
| 2013/0214452 | A1* | 8/2013 | Choi | ...................... | B82Y 40/00 |
| | | | | | 264/293 |
| 2016/0318726 | A1* | 11/2016 | Ikeda | ................. | B65H 23/1806 |
| 2019/0086794 | A1* | 3/2019 | Yu | .......................... | G03F 7/0002 |
| 2020/0070548 | A1* | 3/2020 | Yamada | ............... | B41J 13/0009 |
| 2021/0061649 | A1* | 3/2021 | Sato | ...................... | G03F 7/0002 |

FOREIGN PATENT DOCUMENTS

| | | | | | |
|---|---|---|---|---|---|
| DE | 10158985 | A1 * | 7/2002 | .......... | B65H 23/048 |
| JP | 1065310 | | 3/1998 | | |
| JP | 1998211652 | | 8/1998 | | |
| KR | 200421129 | | 7/2006 | | |
| KR | 200421129 | Y1 * | 7/2006 | | |
| KR | 100922774 | | 10/2009 | | |

OTHER PUBLICATIONS

DE-10158985-A1 English translation (Year: 2002).*
Yale , 2016 (Year: 2016).*
KR Office Action dated Nov. 1, 2022, KR Patent Application No. 10-2021-0128957.

* cited by examiner

REEL-TO-REEL SURFACE PRESS APPARATUS

CROSS-REFERENCE TO RELATED APPLICATION

This application claims the benefit of Korean Patent Application No. 10-2021-0128957, filed on Sep. 29, 2021, in the Korean Intellectual Property Office, the disclosure of which is incorporated herein in its entirety by reference.

BACKGROUND

1. Field

The disclosure relates to an apparatus for pressing a surface of a component transferred in a reel-to-reel method, and more particularly, to a reel-to-reel surface press apparatus which may accurately control a press section.

2. Description of the Related Art

Photo solder resist (PSR) ink for coating a substrate surface is used to allow an electrical signal to flow only through a specific part of a substrate. When a substrate is coated with PSR ink, the substrate is preliminary dried and then pressed by using a roller, a surface pressure press, and the like to improve flatness of the PSR ink, and exposure, development, and curing processes are carried out to finalize the substrate.

A PSR planarization process is carried out for improving flatness of PSR ink to reduce generation of pores in a boundary surface between a die attachment film and a PSR ink surface. However, it is difficult to apply the PSR ink planarization process to a process of continuously coating and drying PSR ink, as in a reel-to-reel method, to make equipment with a vacuum planarization chamber, and furthermore, to uniformly adjust a thickness. Accordingly, the PSR planarization process that is difficult to be applied to a reel-to-reel type has been mainly applied to a panel type only.

In particular, in a reel-to-reel type, a reel is frequently paused and moved, for example, while reel driving is continuously performed in one process, an operation is performed in a stop state in a planarization process. In this process, as an opaque release film covers upper and lower portions of a substrate, a precise displacement of a substrate is difficult so that the substrate may not be accurately located at a desired operation position.

The background description above is technology information that the inventor possessed for the derivation of the disclosure or acquired in the derivation process of the disclosure, and it cannot be said that it is a known technology disclosed to the general public before the filing of the present application.

PRIOR ART DOCUMENT

Patent Literature (Patent Literature 1) Japanese Patent Publication No. 1998-211652 A

SUMMARY

Provided is a reel-to-reel surface press apparatus which may precisely control the position of a substrate by setting a reference point for sensing by forming holes at an edge of a press.

However, such an objective is exemplary, and the objective of the present disclosure to solve is not limited thereby.

Additional aspects will be set forth in part in the description which follows and, in part, will be apparent from the description, or may be learned by practice of the presented embodiments.

According to an aspect of the disclosure, a reel-to-reel surface press apparatus includes an uncoiler and a recoiler, both transferring a component in a reel-to-reel method, a press disposed between the uncoiler and the recoiler, comprising a press plate pressing the component, and having a plurality of reference holes at an equal pitch along an edge of the press plate, a feeder disposed at the rear of the uncoiler and moving the component, and a controller configured to control the component to be transferred based on at least any one of the plurality of reference holes.

In an embodiment, the feeder may include a driving motor operating at the same pitch as the pitch of the plurality of reference holes, and the controller may be further configured to control the feeder to transfer the component at a pitch of an integer multiple of the pitch of the plurality of reference holes.

In an embodiment, the controller may be further configured to stop the uncoiler, the recoiler, and the feeder when the press presses the component, and to operate the uncoiler, the recoiler, and the feeder in a section other than a section in which the press presses the component, to continuously transfer the component.

In an embodiment, the reel-to-reel surface press apparatus may further include a pair of buffer rollers disposed between the uncoiler and the recoiler to face each other in a transfer direction of the component with the press therebetween, and moving in the height direction according to a tension applied to the component, wherein the controller may be further configured to control a movement speed of the component by detecting heights of the pair of buffer rollers.

In an embodiment, the reel-to-reel surface press apparatus may further include a release film attachment portion disposed between the uncoiler and the recoiler and attaching a release film to the component.

In an embodiment, the release film attachment portion may include a release film transfer roller disposed in each of front and rear of the press and attaching a release film to the, a thickness measurement sensor disposed at a side of the release film transfer roller and measuring a thickness of the release film in real time, and a release film driving motor configured to control an operation of the release film transfer roller based on a thickness of the release film measured by the thickness measurement sensor.

In an embodiment, the thickness measurement sensor may include an ultrasound sensor, the release film driving motor may include a servo motor, and the controller may be further configured to control the driving motor to maintain a tension applied to the release film based on the thickness measured by the thickness measurement sensor.

In an embodiment, the reel-to-reel surface press apparatus may further include a centering unit disposed in front of the release film attachment portion and adjusting a position of the release film in the width direction.

In an embodiment, the reel-to-reel surface press apparatus may further include a decover disposed at a rear of the release film attachment portion into which the component is input and including a removal blade to remove the release film.

In an embodiment, the removal blade of the decover may include a pair of removal blades provided apart from each other in the height direction, and as the removal blade located above descends, the component may be inserted between the pair of removal blades and the release film may be removed.

Other aspects, features, and advantages than those described above will become apparent from the following drawings, claims, and detailed description of the disclosure.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
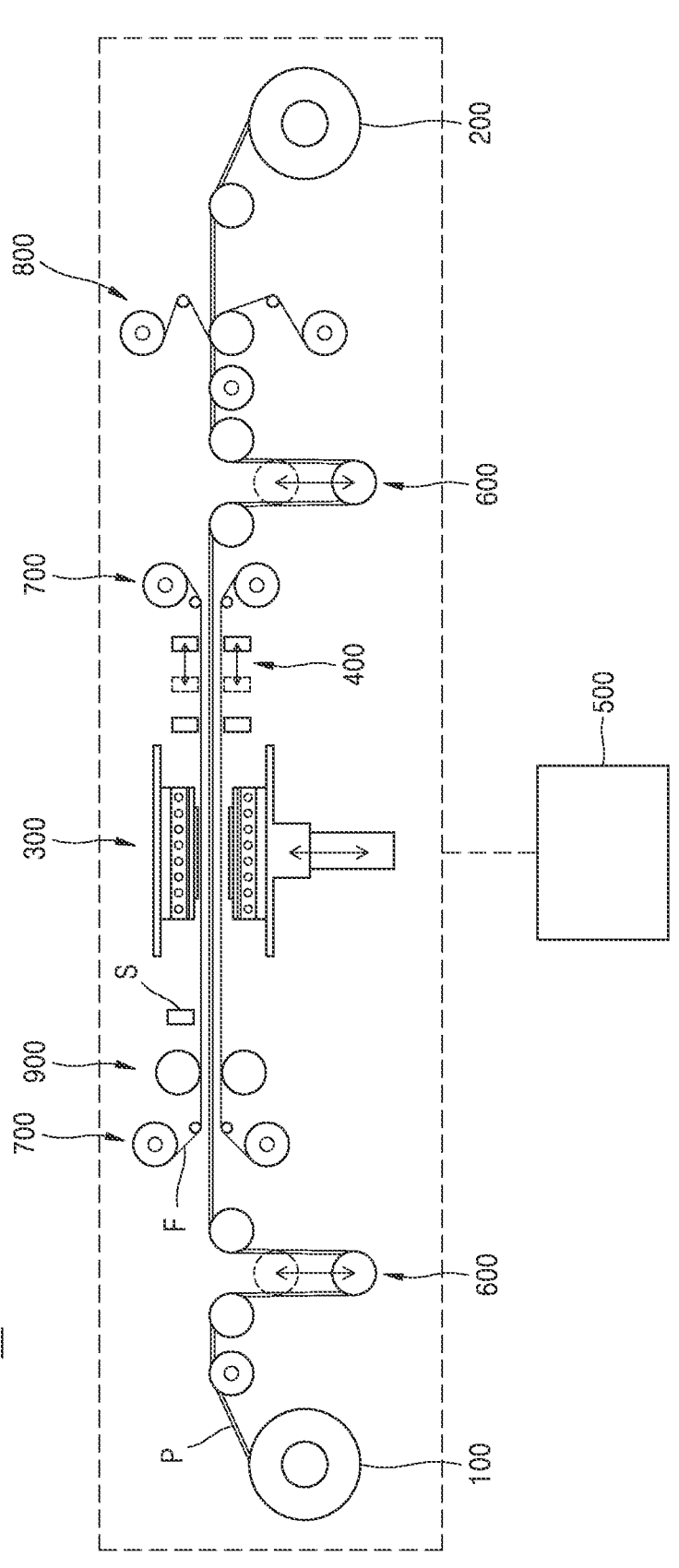
FIG. 1 illustrates a reel-to-reel surface press apparatus according to an embodiment of the disclosure.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

As the disclosure allows for various changes and numerous embodiments, embodiments will be illustrated in the drawings and described in detail in the written description. However, this is not intended to limit the disclosure to particular modes of practice, and it is to be appreciated that all changes, equivalents, and substitutes that do not depart from the spirit and technical scope of the disclosure are encompassed in the disclosure. In the description of the disclosure, even though illustrated in other embodiments, the same identification numbers are used for the same components.

Hereinafter, exemplary embodiments will be described in detail with reference to the accompanying drawings, and in the description with reference to the drawings, the same or corresponding constituents are indicated by the same reference numerals and redundant descriptions thereof are omitted.

In the following embodiment, it will be understood that although the terms "first," "second," etc. may be used herein to describe various components, these components should not be limited by these terms.

In the following embodiment, the expression of singularity in the specification includes the expression of plurality unless clearly specified otherwise in context.

In the following embodiment, when a part may "include" or "have" a certain constituent element, unless specified otherwise, it may not be construed to exclude another constituent element but may be construed to further include other constituent elements.

Sizes of components in the drawings may be exaggerated for convenience of explanation. For example, since sizes and thicknesses of components in the drawings are arbitrarily illustrated for convenience of explanation, the following embodiments are not limited thereto.

In the following embodiment, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When a certain embodiment may be implemented differently, a specific process order may be performed differently from the described order. For example, two consecutively described processes may be performed substantially at the same time or performed in an order opposite to the described order.

The terms used in the specification are merely used to describe embodiments, and are not intended to limit the disclosure. Also, terms such as "include" or "comprise" may be construed to denote a certain characteristic, number, step, operation, constituent element, or a combination thereof, but may not be construed to exclude the existence of or a possibility of addition of one or more other characteristics, numbers, steps, operations, constituent elements, or combinations thereof.

Figure 2:
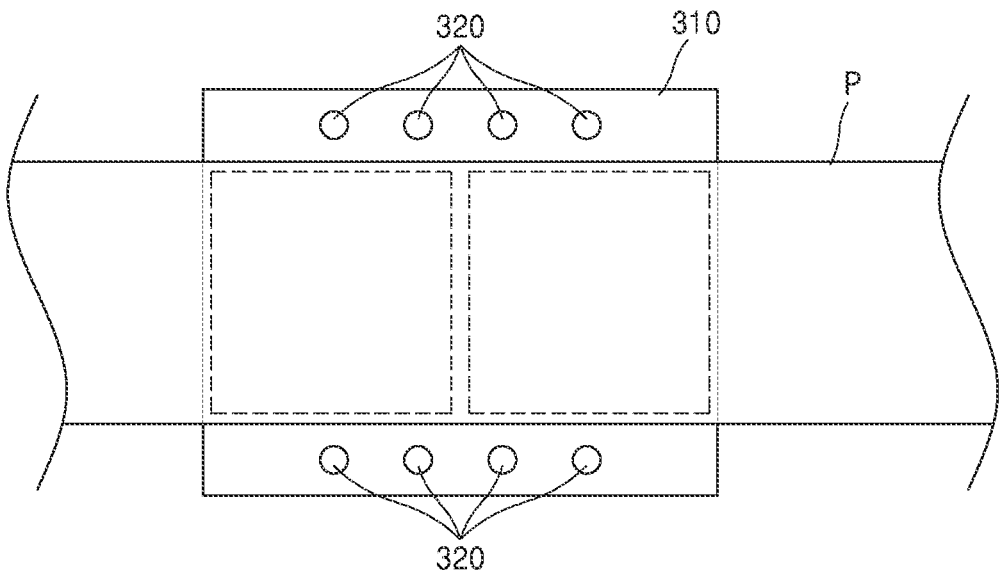
FIG. 2 illustrates a press according to an embodiment of the disclosure.
Figure 3:
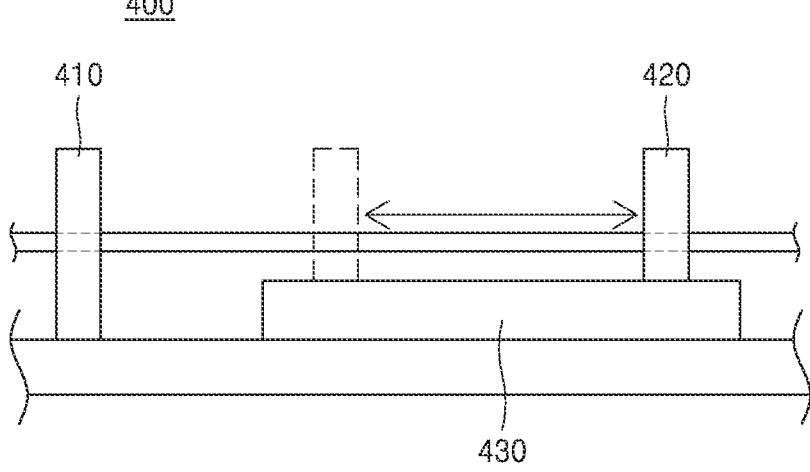
FIG. 3 illustrates a feeder according to an embodiment of the disclosure.
Figure 4:
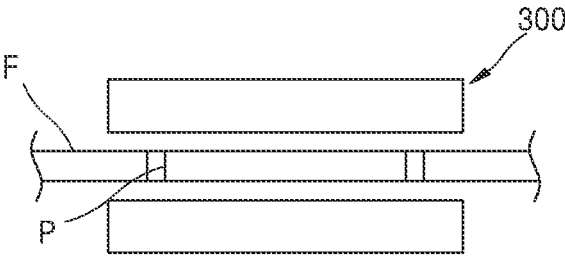
FIG. 4 illustrates a state of a press according to an embodiment of the disclosure pressing a component.
Figure 4:
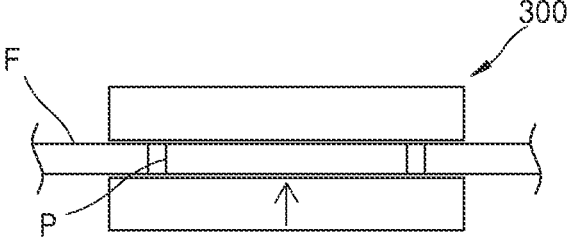
Figure 4:
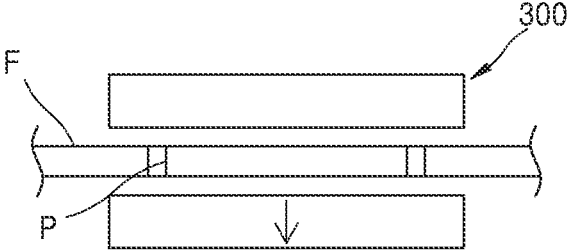
Figure 5:
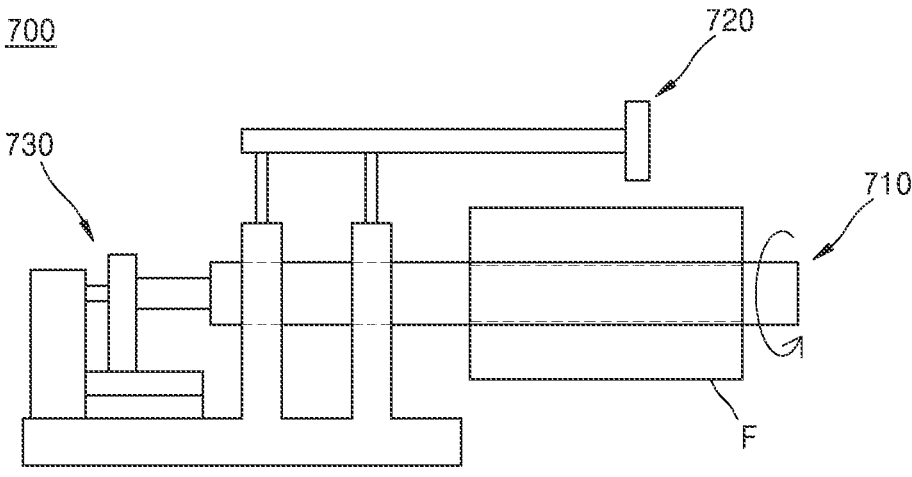
FIG. 5 illustrates a part of a release film attachment portion according to an embodiment of the disclosure.
Figure 6:
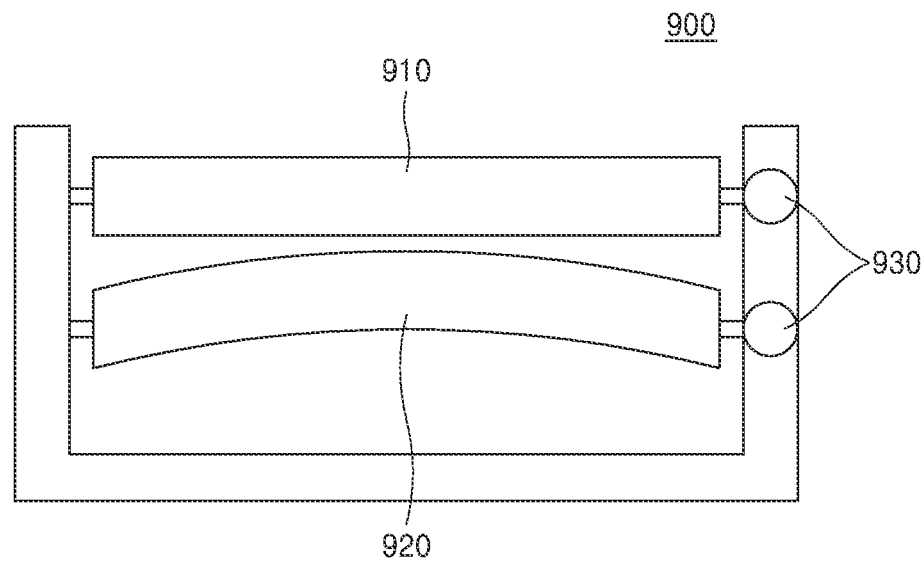
FIG. 6 illustrates a centering unit according to an embodiment of the disclosure.
Figure 7:
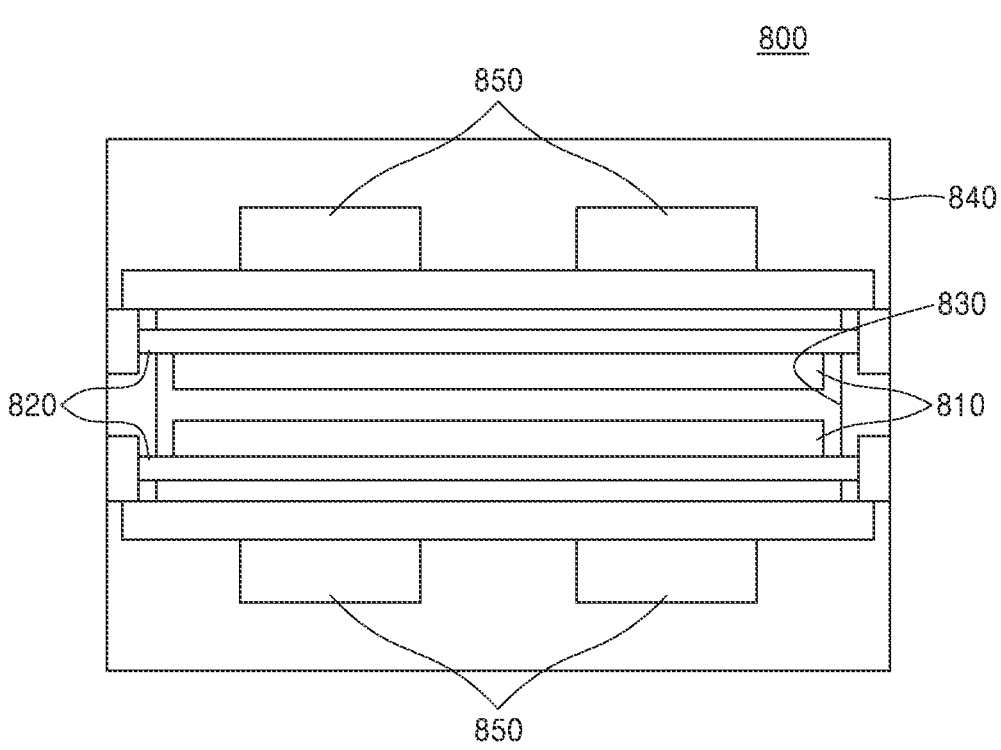
FIG. 7 illustrates a decover according to an embodiment of the disclosure.

FIG. 1 illustrates a reel-to-reel surface press apparatus 10 according to an embodiment of the disclosure. FIG. 2 illustrates a press 300 according to an embodiment of the disclosure. FIG. 3 illustrates a feeder 400 according to an embodiment of the disclosure. FIG. 4 illustrates a state of a press according to an embodiment of the disclosure pressing a component. FIG. 5 illustrates a part of a release film attachment portion 700 according to an embodiment of the disclosure. FIG. 6 illustrates a centering unit 900 according to an embodiment of the disclosure. FIG. 7 illustrates a decover 800 according to an embodiment of the disclosure.

The reel-to-reel surface press apparatus 10 according to an embodiment of the disclosure (hereinafter, referred to as the "surface press apparatus") is an apparatus for pressing a component P while transferring the component P in a reel-to-reel method. In an embodiment, the component P may be a package substrate, and the component P may not be a sheet type, but may be transferred by being attached to a release film and the like and wound around a reel.

The surface press apparatus 10 according to an embodiment of the disclosure may include an uncoiler 100, a recoiler 200, a press 300, a feeder 400, and the controller 500.

As illustrated in FIG. 1, the uncoiler 100 and the recoiler 200 may be disposed apart from each other, respectively, at one side and the other side of the surface press apparatus 10. The component P may be wound around each of the uncoiler 100 and the recoiler 200, and as the uncoiler 100 and the recoiler 200 are rotated, the component P wound around the uncoiler 100 is unwound and moved toward the recoiler 200, and then, wound around the recoiler 200. Accordingly, as a process proceeds, the diameters of the uncoiler 100 and the recoiler 200, that is, the thickness of the component P being wound, may vary.

In an embodiment, the uncoiler 100 and the recoiler 200 may each include a drum having a cylindrical shape, and the like, around which the component P is wound, and a roller for rotating the drum. As the roller rotates, the uncoiler 100 is rotated, and thus, the component P is moved and undergoes a press process, and then, is wound around the recoiler 200.

The press 300 is disposed between the uncoiler 100 and the recoiler 200 and presses the component P. The press 300 may planarize PSR ink by pressing the component P coated with the PSR ink.

In an embodiment, the press 300 includes a press plate 310 for pressing the component P and a plurality of reference holes 320 at an equal pitch along an edge of the press plate 310.

In detail, as illustrated in FIG. 2, the press 300 may include the press plate 310 having a width greater than the width of the component P. The shape of the press plate 310 is not particularly limited, and it suffices to cover the entire component P in a width direction thereof. For example, the press plate 310 may be a rectangle in which edges parallel to a transfer direction of the component P are long sides.

In an embodiment, the press plate 310 may be provided in a pair. For example, as illustrated in FIG. 1, the pair of press plates 310 are disposed to face each other in the height direction with the component P therebetween, and at least one of the pair of press plates 310 moves relative to the other to press the component P.

In detail, as illustrated in FIG. 4, when the component P enters a press area, the pair of press plates 310 maintain a state of being separated from each other (In this state, the component P may be in a state of being coated with a release film F). When the component P completely enters the press area, that is, to be located to correspond to the pair of press plates 310, the transfer of the component P is stopped.

The pair of press plates 310 move toward each other to press the component P. Although the press plate 310 located below is illustrated as ascending, the press plate 310 located above may move downward, or both of the pair of press plates 310 may approach each other. After pressing, the pair of press plates 310 are separated from each other, and the transfer of the component P resumes.

In an embodiment, the reference holes 320 may be formed at the edge of the press plate 310. For example, as illustrated in FIG. 2, the reference holes 320 may be arranged along the long sides of the press plate 310. In an embodiment, the reference holes 320 may be arranged at equal intervals, that is, at an equal pitch.

The reference holes 320 may be used to precisely control the position of the component P that has entered the press area (an area where the press process is performed, for example, an area covered by the press plate 310). In other words, when the component P is temporarily stopped for pressing, a fine press process is possible by setting a stop position of the component P based on the reference holes 320, which is described below.

Although FIG. 2 illustrates four reference holes at each long side as the reference holes 320, the number of reference holes 320 is not particularly limited.

A vision camera S is disposed at one side of the press 300 and detects the positions of the press 300 and the component P. The controller 500 described below may control the position of the component P with respect to any one of the reference holes 320, based on the position detected by the vision camera S.

The feeder 400 is disposed at the rear of the uncoiler 100 and moves the component P. For example, as illustrated in FIG. 1, the feeder 400 is disposed at the rear of the press 300, and may stop the operation before the press process starts and move the component P after the press process is complete.

In an embodiment, the feeder 400 may include a fixed gripper 410, a movable gripper 420, and a driving motor 430.

As illustrated in FIG. 3, the fixed gripper 410 may be fixedly disposed in front of the feeder 400. The fixed gripper 410 may include a clamp for fixing the component P. When the press process is performed on the component P, that is, the component P is stopped, the clamp of the fixed gripper 410 may fix the component P. Then, when the press process is complete, the clamp is separated from the component P so that the component P may move again.

The movable gripper 420 is disposed at the rear of the fixed gripper 410, and may be moved by the driving motor 430 in the transfer direction of the component P. The movable gripper 420, like the fixed gripper 410, may include a clamp for fixing the component P, and may fix the component P or be separated from the component P to move the component P, according to the press process.

In an embodiment, the driving motor 430 may be a linear motor that is driven at the same pitch as the reference holes 320 formed in the press 300. In other words, a distance of one step by which the driving motor 430 moves may be the same pitch as the pitch between the reference holes 320. Accordingly, the movable gripper 420 may transfer the component P at the same pitch as the reference holes 320, and thus, the surface press apparatus 10 according to an embodiment of the disclosure may delicately control the position of the component P.

In detail, according to the reel-to-reel method, while the component P is continuously transferred, in the press process, the component P needs to be stopped for its characteristics. Accordingly, when the component P enters the press area, the component P stops, the press process is performed, and then the component P is transferred again. In other words, in a general surface press apparatus, the component P unavoidably repeats transfer and strop, and in this process, due to allowance of the apparatus, inertia of the component P that moves, or the like, the component P may not be accurately located in the press area.

To address the above issue, in the surface press apparatus 10 according to an embodiment of the disclosure, any one of the reference holes 320 formed in the press 300 is set as a reference position, and the vision camera S detects the position of the component P in real time. When the component P enters the press area, the feeder 400 adjusts the position of the movable gripper 420 by using the driving motor 430. In this state, the movable gripper 420 may move at a pitch of an integer multiple of the pitch of the reference holes 320. In other words, as the driving motor 430 operates at the same pitch as the pitch of the reference holes 320, the movable gripper 420 may also move at the same interval as the pitch of the reference holes 320. Accordingly, the stop position of the component P may be finely adjusted.

The controller 500 controls other elements of the surface press apparatus 10, may be connected to the uncoiler 100, the recoiler 200, the press 300, the feeder 400, and like in a wired/wireless manner to control the same.

In an embodiment, when the component P enters the press area, the controller 500 sets any one of the reference holes 320 of the press 300 as a reference point, based on position information received from the vision camera S. The controller 500 controls the feeder 400 to adjust the position of the component P based on the reference holes 320 corresponding thereto. For example, by controlling the driving motor 430 of the feeder 400, the controller 500 may control the movable gripper 420 to move at a pitch of an integer multiple of the pitch of the reference holes 320.

In an embodiment, the controller 500 stops the component P when the press 300 presses the component P, and move the component P before or after the press 300 presses the component P. For example, when the press 300 presses the component P, the controller 500 may stop the uncoiler 100, the recoiler 200, and the feeder 400, and in a section other than a section in which the press 300 presses the component P, the controller 500 may stop the uncoiler 100, the recoiler 200, and the feeder 400. In other words, the surface press apparatus 10 may stops the component P only in the press area, and continuously transfer the component P in an area other than the press area.

The surface press apparatus 10 may further include a pair of buffer rollers 600. As illustrated in FIG. 1, the pair of buffer rollers 600 may be disposed between the uncoiler 100 and the recoiler 200 to face each other in the transfer direction of the component P with the press 300 therebetween.

In an embodiment, the height of each of the buffer rollers 600 may vary depending on a tension applied to the component P. For example, when the tension applied to the component P is relatively large, the buffer rollers 600 ascends, and when the tension applied to the component P is relatively small, the buffer rollers 600 descends. Accordingly, the controller 500 may control a movement speed of the component P based on the heights of the buffer rollers 600.

The surface press apparatus 10 may further include a release film attachment portion 700. As illustrated in FIG. 1, the release film attachment portion 700 is disposed between the uncoiler 100 and the recoiler 200, and the release film F may be attached to the component P. For example, the release film attachment portion 700 may be disposed in each of the front and rear of the press 300.

In an embodiment, the release film F that the release film attachment portion 700 applies to the component P may be a secondary release film to prevent the component P from being contaminated in the press process. In other words, before the secondary release film is attached by the release film attachment portion 700, a primary release film may be attached to the component P. After the release film attachment portion 700 applies the secondary release film to the component P, the press process is performed on the component P, and then, after the secondary release film is collected, the primary release film may be removed by a decover 800 described below.

As illustrated in FIG. 5, the release film attachment portion 700 may include a release film transfer roller 710, a thickness measurement sensor 720, and a release film driving motor 730.

The release film transfer roller 710, which is a roller around which the release film F is wound, is disposed in each of the front and rear of the press 300, and may transfer the release film F by rotating in one direction. For example, the release film transfer roller 710 may attach the release film F to the component P that is transferred through the uncoiler 100. Furthermore, a roller for attaching the release film F may be disposed in front of the press 300, and a roller for collecting the release film F may be disposed at the rear of the press 300.

The thickness measurement sensor 720 is disposed at one side of the release film transfer roller 710, and may measure a thickness of the release film F wound around the release film transfer roller 710. In detail, as the press process is performed, the thickness of the release film F wound around the release film transfer roller 710 gradually decreases, and thus, the magnitude of tension applied to the release film F varies. Accordingly, wrinkles and the like may occur in the release film F, which causes degradation of the quality of the component P.

To prevent the above, the thickness measurement sensor 720 may measure, in real time, the thickness of the release film F wound around the release film transfer roller 710. The thickness measurement sensor 720 may be disposed in at least one of the roller for attaching the release film F and the roller for collecting the release film F. The controller 500 may control the release film driving motor 730 that rotates the release film transfer roller 710 to maintain constant the tension applied to the release film F based on the measured thickness.

In an embodiment, the thickness measurement sensor 720 may include an ultrasound sensor, and the release film driving motor 730 may include a servo motor. In other words, the controller 500 may the release film driving motor 730 with the thickness of the release film F measured by the thickness measurement sensor 720 as an input value, and the tension applied to the release film F as an output value. Accordingly, even when a thickness change occurs in the release film F, the tension applied to the release film F may be maintained constant by adjusting a driving speed, a driving cycle, or the like of the release film driving motor 730.

The surface press apparatus 10 may further include the decover 800.

As illustrated in FIGS. 1 and 7, the decover 800 is disposed at the rear of the release film attachment portion 700 and used to remove the release film F attached to the component P after the press process is complete, in detail, the primary release film before being input to the release film attachment portion 700.

In an embodiment, the decover 800 may include a removal blade 810, a blade adjustment portion 820, a window 830, a support 840, and a height adjustment portion 850.

The removal blade 810 may remove the release film F attached to the component P, in detail the primary release film. For example, the removal blade 810 is provided in a pair disposed apart from each other in the height direction such that blades are disposed to point in a direction in which the component P enters. Accordingly, as the component P passes through the pair of removal blades 810, the release film F is removed, and the component P removed of the release film F is discharged through the window 830.

The blade adjustment portion 820 is a member for controlling the position or an orientation angle of the removal blade 810. For example, when the thickness of the component P or the release film F is relatively thick, the blade adjustment portion 820 may control such that end portions of the removal blades 810 are further separated from each other. In an embodiment, the blade adjustment portion 820, which is a roller, may rotate in contact with the removal blade 810, and control the orientation angle of the removal blade 810.

The window 830 is an open area formed inside the decover 800, through which the component P may enter and exit. In an embodiment, the width of the window 830 may be greater than the width of the removal blade 810.

Other members of the decover 800 may be disposed and fixed on the support 840. Furthermore, the height adjustment portion 850 is disposed at one side of the support 840, and may adjust the height of each of the removal blades 810.

The surface press apparatus 10 may further include a centering unit 900.

In an embodiment, the centering unit 900 is disposed at the rear of the release film attachment portion 700 into which the component P is input, among a pair of the release film attachment portions 700, and may adjust the position of the release film F in the width direction. As illustrated in FIG. 6, the centering unit 900 may include a first roller 910, a second roller 920, and a roller adjustment portion 930.

The first roller 910 is a roller disposed in the upper side of the centering unit 900, and may have a cylindrical shape with a flat outer circumferential surface. The second roller 920 is disposed below the first roller 910, and may have a convex shape toward the first roller 910. The release film F enters between the first roller 910 and the second roller 920.

In an embodiment, the second roller 920 may adjust the position of the release film F. In detail, when the release film F is placed on the second roller 920, the position of the second roller 920 may be adjusted by controlling the roller adjustment portion 930. As the second roller 920 has a shape bent toward the first roller 910, the position of the release film F may be adjusted in the width direction according to the position of the second roller 920. Accordingly, by aligning the release film F, the release film F may be attached at an accurate position on the component P.

Next, the press process of the component P by using the surface press apparatus 10 according to an embodiment of the disclosure is described with reference to FIGS. 1 to 7.

First, as the uncoiler 100, the recoiler 200, and the feeder 400 operate, the component P wound around the uncoiler 100 is unwound and transferred in one direction. The pair of buffer rollers 600 disposed at the rear of uncoiler 100 and in front of the recoiler 200 have the heights that vary according to the tension applied to the component P, and the controller 500 may control a component transfer speed of the uncoiler 100 and the recoiler 200 by detecting the heights of the buffer rollers 600.

The component P is transferred to the release film attachment portion 700 by passing through the buffer rollers 600. The release film attachment portion 700 may attach the release film F on the component P. The component P may be already coated with the primary release film, and the release film attachment portion 700 may attach the secondary release film to the component P before the component P enters the press 300. As the release film transfer roller 710 of the release film attachment portion 700 rotates, the release film F is attached on the component P, and the thickness measurement sensor 720 detects, in real time, the thickness of the release film F wound around the release film transfer roller 710. The controller 500 may control the release film driving motor 730 to apply a constant tension to the release film F, based on the measured thickness.

In an embodiment, the centering unit 900 may be disposed at the rear of the release film transfer roller 710 of the release film attachment portion 700 into which the component P enters. The centering unit 900 may center the release film F by adjusting the position of the second roller 920 that is an expander roller having a bent shape.

When the component P enters the press area, the controller 500 set a stop position of the component P. In detail, the controller 500 controls the feeder 400 based on any one of the reference holes 320 of the reference holes 320 of the press plate 310. The driving motor 430 of the feeder 400 may rotate at the same pitch as the pitch of the reference holes 320 of the press plate 310, and the controller 500 may set the stop position of the component P by controlling the position of the movable gripper 420.

When the component P arrives at the stop position, the controller 500 stops the component P so as not to be further transferred. In other words, the controller 500 stops the uncoiler 100, the recoiler 200, and the feeder 400 to prevent the component P from being further transferred. The fixed gripper 410 and the movable gripper 420 of the feeder 400 may be stopped fixing the component P.

When the component P is stopped, the press plates 310 are moved toward each other to press the component P. When the press process ends, the press plates 310 are moved again, and the controller 500 operates the uncoiler 100, the recoiler 200, and the feeder 400 to transfer the component P.

When the component P passes through the press 300, the release film transfer roller 710 of the release film attachment portion 700 collects the release film F.

When the component P arrives at the decover 800, a front end of the removal blade 810 of the decover 800 contacts the boundary between the component P and the release film F. As the component P is transferred with the removal blade 810 being fixed, the release film F may be delaminated from the component P.

The surface press apparatus 10 according to an embodiment of the disclosure may perform an accurate press process on the component P transferred in a reel-to-reel method.

The surface press apparatus 10 according to an embodiment of the disclosure may instantly respond to a change in the tensions applied to the component P and the release film F as the process proceeds, the quality of press process may be improved.

The surface press apparatus 10 according to an embodiment of the disclosure may reduce the total process by configuring the decover function in line with the press process.

As such, although embodiments have been described, these are merely exemplary. Those skilled in the art to which the present disclosure pertains could make various modifications and changes from these descriptions. Accordingly, the technical protection scope of the disclosure should be construed based on the accompanying claims.

The specific technical content described in an embodiment is merely an embodiment, not defining the technical scope of the embodiment. In order to describe the description of the invention concisely and clearly, the description of the general technology and configuration according to the related art may be omitted. Furthermore, connection lines or connection members between the constituent elements shown in the drawings are merely illustrative of functional connections and/or physical or circuit connections. In an actual device, a connection between the constituent elements may be indicated by various functional connections, physical connections, or circuit connections that can be replaced or added. Furthermore, no item or component is essential to the practice of the disclosure unless the element is specifically described as "essential" or "critical."

The use of terms "a" and "an" and "the" and similar referents in the context of describing the disclosure are to be construed to cover both the singular and the plural. Furthermore, recitation of ranges of values herein are merely intended to serve as a shorthand method of referring individually to each separate value falling within the range, unless otherwise indicated herein, and each separate value is incorporated into the specification as if it were individually recited herein. Furthermore, the steps of all methods described herein can be performed in any suitable order unless otherwise indicated herein or otherwise clearly contradicted by context. The embodiment is not limited to the described order of the steps. The use of any and all examples, or language (e.g., "such as") provided herein, is intended merely to better illuminate the disclosure and does not pose a limitation on the scope of the disclosure unless otherwise claimed. Furthermore, numerous modifications and adaptations will be readily apparent to those of ordinary skill in this art without departing from the spirit and scope of the disclosure.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope of the disclosure as defined by the following claims.

What is claimed is:

1. A reel-to-reel surface press apparatus comprising:
an uncoiler and a recoiler, both transferring a component in a reel-to-reel method;
a press disposed between the uncoiler and the recoiler, comprising a press plate pressing the component, and having a plurality of reference holes at an equal pitch distribution along an edge of the press plate;
a feeder disposed at the rear of the uncoiler and moving the component; and
a controller configured to effect control of movement of the component transferred based on no more than one reference hole of the plurality of reference holes.

2. The reel-to-reel surface press apparatus of claim 1, wherein the feeder comprises a driving motor operating at a same pitch as the pitch of the plurality of reference holes, and
the controller is further configured to control the feeder to transfer the component at a pitch of an integer multiple of the pitch of the plurality of reference holes.

3. The reel-to-reel surface press apparatus of claim 1, wherein the controller is further configured to stop the uncoiler, the recoiler, and the feeder when the press presses the component, and to operate the uncoiler, the recoiler, and the feeder in a section other than a section in which the press presses the component to continuously transfer the component.

4. The reel-to-reel surface press apparatus of claim 1, further comprising a pair of buffer rollers disposed between the uncoiler and the recoiler to face each other in a transfer direction of the component with the press therebetween, and moving in a height direction according to a tension applied to the component,
wherein the controller is further configured to control a movement speed of the component by detecting heights of the pair of buffer rollers.

5. The reel-to-reel surface press apparatus of claim 1, further comprising a release film attachment portion disposed between the uncoiler and the recoiler and attaching a release film to the component.

6. The reel-to-reel surface press apparatus of claim 5, wherein the release film attachment portion comprises: a release film transfer roller disposed in each of front and rear of the press and attaching a release film to the component;
a thickness measurement sensor disposed at a side of the release film transfer roller and measuring a thickness of the release film in real time; and
a release film driving motor configured to control an operation of the release film transfer roller based on a thickness of the release film measured by the thickness measurement sensor.

7. The reel-to-reel surface press apparatus of claim 6, wherein the thickness measurement sensor comprises an ultrasound sensor,
the release film driving motor comprises a servo motor, and
the controller is further configured to control the driving motor to maintain a tension applied to the release film based on the thickness measured by the thickness measurement sensor.

8. The reel-to-reel surface press apparatus of claim 5, further comprising a centering unit disposed in front of the release film attachment portion and adjusting a position of the release film in a width direction.

9. The reel-to-reel surface press apparatus of claim 5, further comprising a decover disposed at a rear of the release film attachment portion into which the component is input and comprising a removal blade to remove the release film.

10. The reel-to-reel surface press apparatus of claim 9, wherein the removal blade of the decover comprises a pair of removal blades provided apart from each other in a height direction, and as the removal blade located above descends, the component is inserted between the pair of removal blades and the release film is removed.

* * * * *